Figure 1:
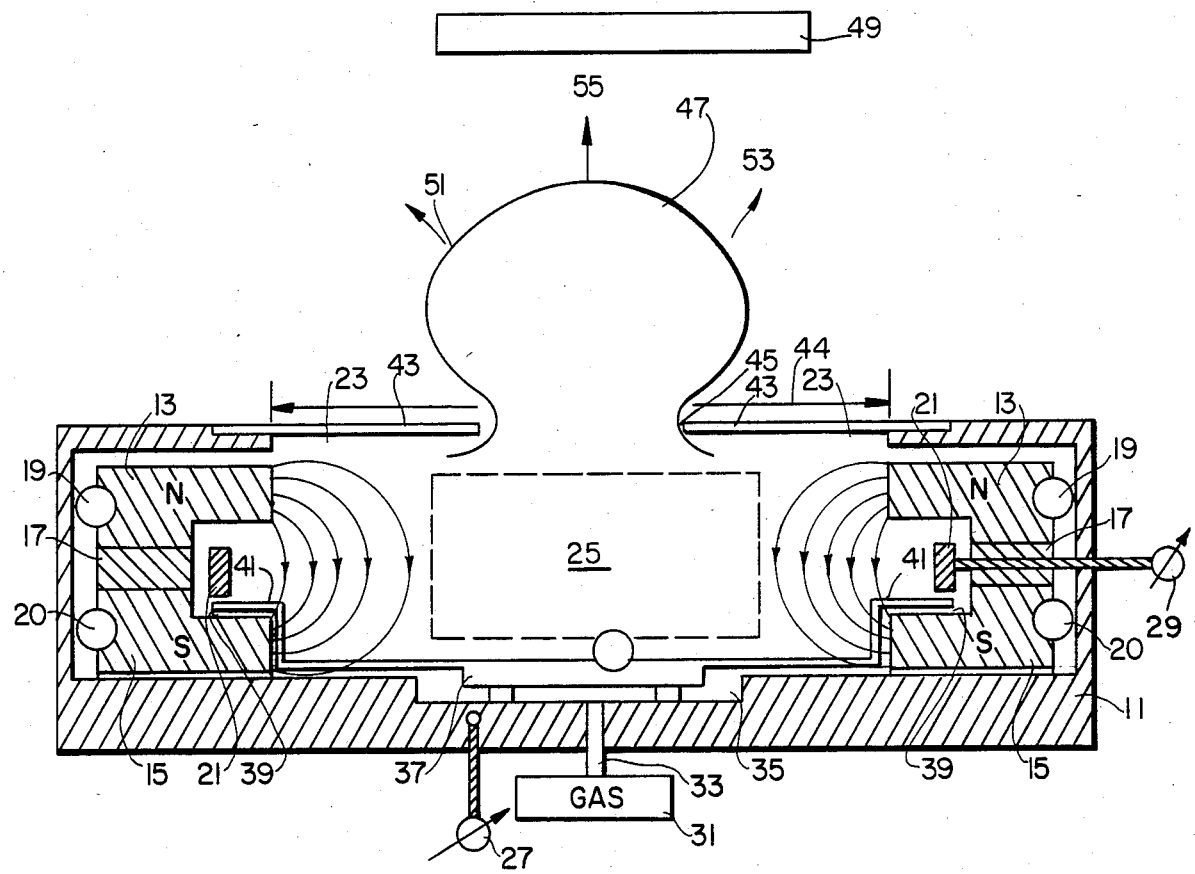

United States Patent [19]

Lee et al.

[11] Patent Number: 4,652,795
[45] Date of Patent: Mar. 24, 1987

[54] EXTERNAL PLASMA GUN

[75] Inventors: Kon J. Lee, Stratford; Anthony Musset, Haddon Heights; Richard A. Denton, Marlton, all of N.J.

[73] Assignee: Denton Vacuum Inc., Cherry Hill, N.J.

[21] Appl. No.: 712,019

[22] Filed: Mar. 14, 1985

[51] Int. Cl.$^4$ .......................... H01J 7/24; H05H 1/00
[52] U.S. Cl. .................. 315/111.41; 315/111.31; 315/111.81; 313/360.1
[58] Field of Search ................. 315/111.41, 111.21, 315/111.51, 111.91, 111.8, 111.31; 313/360, 36, 217, 240

[56] References Cited

U.S. PATENT DOCUMENTS

| | | | |
|---|---|---|---|
| 3,760,225 | 9/1973 | Ehlers et al. | 315/111.31 X |
| 3,955,118 | 5/1976 | Flemming | 315/111.81 |
| 4,301,391 | 11/1981 | Seliger et al. | 315/111.21 X |
| 4,390,494 | 6/1983 | Salisbury | 315/111.41 X |
| 4,570,106 | 2/1986 | Sohval et al. | 315/111.31 X |

Primary Examiner—Larry Jones
Attorney, Agent, or Firm—William E. Cleaver

[57] ABSTRACT

The present device comprises, in a preferred embodiment, a permanent magnet assembly which is formed to closely resemble a doughnut with the inside surface defining an aperture having first and second ends. Said inside surface is formed concave to substantially resemble the letter "C." The permanent magnet provides magnetic flux from one end of the "C" shaped inside surface to the other end. Hence the magnetic flux lines, or the magnetic flux field, form an enclosure with the concave configuration of the inside surface. An anode is located within the enclosure and is shielded by the magnetic flux field, i.e., the magnetic flux impedes the electrons from directly striking the anode. A cathode means is fitted over said first end of the aperture of the permanent magnetic assembly. A plasma exit plate, having a substantially large aperture therein, is fitted over said second end of the aperture of the permanent magnetic assembly. A source of electrical voltage (which has a first terminal with a first voltage and a second terminal with a second voltage, said second voltage being negative with respect to said first voltage) has its first and second terminals respectively connected to said anode and said cathode to cause an electrostatic field therebetween. In the preferred embodiment the voltage sources are independently variable. In addition, the present device has a means for uniformly passing ionizable gas into the chamber defined by the position of the magnetic flux, the position of the cathodes and the position of the plasma exit plate. Accordingly when electrical energy is applied to the anode and the cathode, a dense plasma results and a substantial amount of the plasma exists above said substantially large aperture to provide a body of plasma external to the device.

11 Claims, 3 Drawing Figures

EXTERNAL PLASMA GUN

BACKGROUND

Ion beams can be and are used in substrate cleaning, co-deposition of materials, ion assisted deposition, ion milling, ion etching and the like. The present device can be and is advantageously used in any and all of the above mentioned applications.

In the prior art, the technique has been to produce plasma and direct the ions therefrom through a screen (the screen has a voltage which is negative to the plasma body to extract ions from the plasma, to form an ion beam) toward a substrate. This technique has worked reasonably well except that as the ions bombard the substrate, the substrate takes on a positive voltage bias and ions start being repelled by the substrate. The present device acts to provide a plasma external to the gun and this plasma which contains both ions and electrons provides ions for the ionic actions, but provides electrons to neutralize the positive charge on the substrate from the ion bombardment thereby mitigating the repelling effect.

SUMMARY

The present device is a mechanism for producing a plasma body, or plasma cloud, external to the mechanism. The external plasma body can be directed, shaped and concentrated by electrodes or magnetic fields placed outside of the exit aperture plate. In a preferred embodiment, the device employs a permanent magnet, which is substantially doughnut shaped. The inside surface of the doughnut shaped magnet is concave shaped so that magnetic flux passes from one end of the concave shaped inside surface to the other end of the concave shaped surface. An enclosure is formed between the magnetic flux and the inside concave shaped surface. An anode is located in the enclosure so that the electrons are impeded from directly striking the anode. By inhibiting the electrons from passing to the anode the ionization process is more effective and the plasma which is generated is dense. The device, of course, has a cathode and the cathode is formed to fit over one end of the aperture formed through the doughnut. In a preferred embodiment every conducting body other than the anode is part of the cathode although throughout the description the cathode will be described as the plate means located at the end of the doughnut shaped magnet opposite the exit plate. When the cathode is connected to a negative voltage and the anode is connected to a positive voltage there is an electrostatic field developed therebetween. Over the end of the doughnut aperture, opposite the cathode, there is fitted an exit aperture plate. Over a substantial portion of the cathode surface which is exposed to the aperture within the doughnut, there is located a baffle. Ionizable gas is passed through the cathode and dispersed around the baffle and directed to uniformly enter the plasma chamber between the anode and said concave inside surface. The action of uniformly passing the ionizable gas into the plasma chamber from behind the anode aids in causing an efficient generation of a dense plasma. The plasma is generated, in response to the presence of the ionizable gas and the crossed electrostatic and magnetic fields, in the plasma chamber and in addition parts of the plasma exist outside the large aperture in the plasma exit plate, i.e., a plasma body exists external to the gun.

Figure 2:
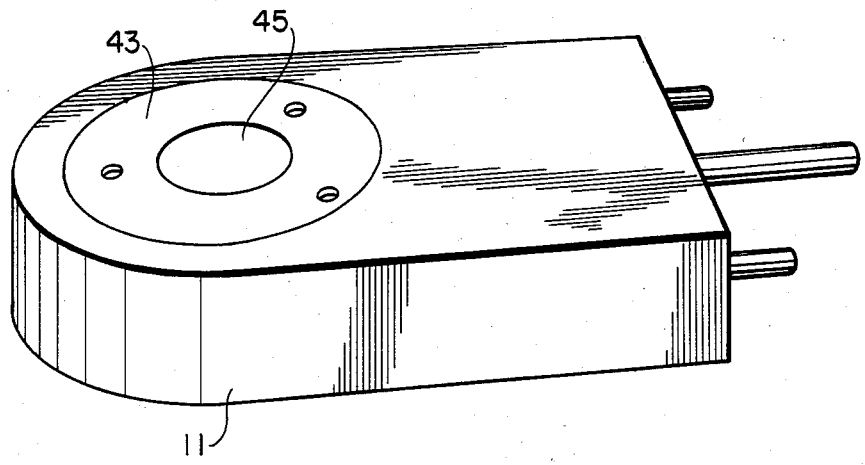
Figure 3:
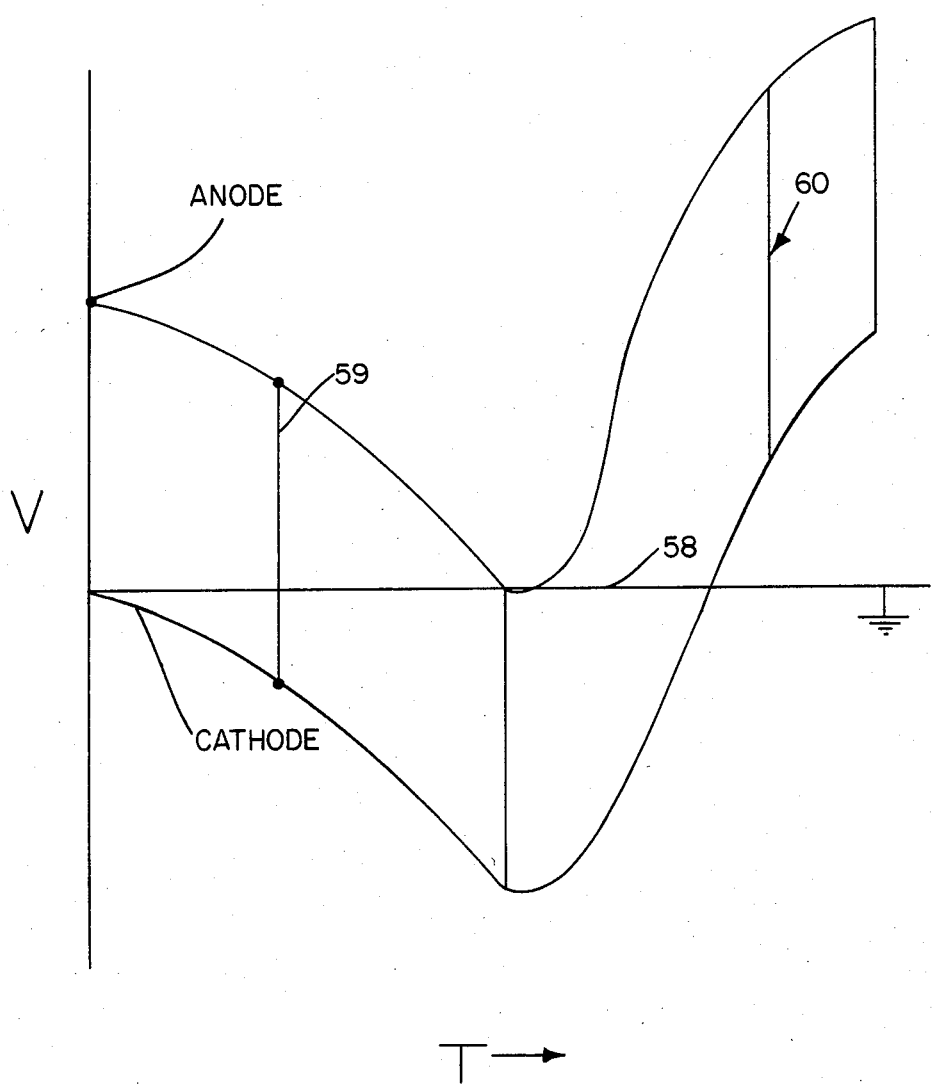

The object and features of the present invention will be better understood when the following description is studied along with the drawings wherein:

FIG. 1 is a sectional side view of the plasma gun; and
FIG. 2 is a pictorial schematic of the plasma gun.
FIG. 3 is a voltage-time graph to help explain the technique of varying the speed of the ions.

Consider FIG. 1. In FIG. 1 there is shown in cross section a housing 11. The housing 11 is fabricated from aluminum or other suitable non-magnetic electrically conducting material. In a preferred embodiment the toroidal section has a 10 cm inside diameter and is 5 cm high. Within the housing 11, there are located two ring shaped magnetizable members 13 and 15. While the members 13 and 15 are ring shaped in the preferred embodiment they could be simply an endless shaped member such as an oblong shaped device. The two magnetizable members 13 and 15, in a preferred embodiment are fabricated from easily magnetized material such as soft iron. The two magnetizable rings 13 and 15 are connected by a plurality of insert magnets 17 having their north and south poles oriented to provide for flux generated as shown by flux 23. It should be understood that the insert magnets could have the polarities oriented in the opposite direction. It should also be understood that the flux is considered to be substantially parallel with the axis of the toroidal section and while an oblong section may not have an axis the flux would be considered nonetheless passing substantially parallel to the aperture normal.

As can be further gleaned from FIG. 1, wound around the magnetizable members 13 and 15 are two water cooling pipes 19 and 20. The water cooling pipes 19 and 20 are connected to a suitable cold water source, so that the water can be pumped therethrough to maintain the gun in a cooled state. Both the cathode and anode heat up to some extent even though the system is considered a cold cathode system. The cathode does not become thermionic, although it should be understood the present device can work with a hot cathode installation. The generation of magnetic flux is well understood in the art and any suitable magnetic flux generating means could be used provided it meets the obvious constraints of the present device, such as providing the flux in such form that it can be used to shield the anode from the plasma as will be explained in more detail hereinafter. It should also be understood that forms of cooling fluids other than water could be used.

It will be noted in FIG. 1 that the location and shape of the rings 13 and 15 cause the magnetic flux generating means to assume the shape of the letter "C." To say it another way, the inside surface of the magnetic flux generating means is shaped concave. Within the concave configuration there is located an anode element 21. The anode 21 is ring shaped and suitably mounted and electrically isolated from the magnetic flux generating means. It becomes apparent that when the magnetic flux generating means is generating flux, the flux takes the shape of the flux 23 and acts to shield the anode 21. In other words the flux 23 forms an enclosure with the concave configuration of the inside surface of the magnetic flux generating means. The anode 21, being within that enclosure, is shielded from the electrons, i.e., the electrons are impeded from directly striking the anode. The base of the housing 11 acts as part of the cathode structure and is connected to a variable direct current potential source 27 which is always held negative with respect to the anode. The variable potential source 27 can be any well known variable d.c. source of electrical energy. The cathode is held at a voltage which is negative with respect to the anode 21. In some applications the cathode is held negative with respect to ground while in other applications it is held positive with respect to ground. The anode 21 is connected through the array of insert permanent magnets 17 and through the housing 11 to a variable source of voltage 29. The voltage source 29 can be any well known variable d.c. source of electrical energy and is held positive with respect to the cathode.

When suitable electrical power is applied between the sources 27 and 29 there is an electrostatic field created between the anode and the cathode and the stage is set for the introduction of an ionizable gas such as nitrogen, argon, or oxygen. The ionizable gas is supplied from a source of gas 31, through the housing 11, by virtue of the channel 33, into a conduit 35. The gas conduit 35 is formed by the baffle 37 and the housing 11. As can be seen in FIG. 1, the baffle 37 is step shaped so that its final opening 39 is in close proximity to the anode 21. The gap between the anode 21 and baffle 37 is of appropriate size to prevent arcing thereacross. It should be understood that this baffle 37 is circular shaped so that the gas conduit 35 directs the gas to the edge of the shielded enclosure, behind the ring shaped anode 21. We have found that if the gas is delivered uniformly around the edge of the shielded enclosure and then passed into the plasma chamber, the efficiency of production and the density, of the plasma is improved. We have found that if the baffle were to terminate at the first step point, i.e., point 41, the efficiency and density are improved over simply passing gas directly into the chamber from one or more orifices.

When the ionizable gas has been passed through the conduit 35, into the chamber, a plasma will be generated and there will be collisions between molecules of gas, and ions, and electrons. The magnetic shielding of the anode causes the electrons to orbit and the plasma is then confined and dense. Heretofore a negatively charged grid has been employed and located between the substrate and the plasma phenomenon. In this prior art arrangement ions and electrons headed for the outside world from the plasma chamber with the electrons, in great number, being repelled by the charged grid and many of the ions passing through the grid to bombard the substrate. In the present device there is an exit aperture plate, located on the top end of the chamber, i.e., the upper end of the aperture in the magnetic flux generating device. In a preferred embodiment the exit aperture plate has an aperture 45 of 3 cm. The aperture diameter can vary to some degree. The range of the diameter of the aperture 45 is from 15% to 60% of the diameter of the aperture 44, i.e., the aperture of the doughnut shaped magnetic flux generating means. The aperture 45 must be saall enough to maintain a large pressure difference. On the other hand, it cannot be so small that it would inhibit the generation of the external plasma. The aperture size is dependent to some degree on the gas used, the electrostatic field generated and the intended application. In any event, when compared to the spaces in grids of the prior art, aperture 45 is a substantially large aperture.

When the plasma is generated in the plasma chamber 25, which generation occurs instantaneously upon application of electrical power, the plasma extends through the aperture 45 into a configuration shown in FIG. 1.

The plasma body 47 is composed of electrons and ions and energetic neutrals. The external plasma 47 is directed to a substrate, such as a substrate 49 which is bombarded by ions, electrons and neutrals. We have found a number of useful applications with the external plasma as compared with the prior art ion gun. For instance we have found that the uniformity of substrate etching to be very much enhanced when using the present device as compared to a prior art ion gun. We believe that the inclusion of the electrons in the plasma serves to neutralize the charge after the ions have come to rest in or on the substrate and hence the substrate does not build up a positive charge to repel incoming ions. We have found that in some modes of operation the external plasma has a predominance of ions in one section thereof and a predominance of electrons in another section thereof. This feature is useful where there is a requirement to periodically neutralize a moving substrate or there is a requirement to alternately effect ion and electron bombardment of a substrate.

The present plasma gun is useful where there is a requirement to reduce the energy of the ions so that the bombardment of the substrate is moderated. It should also be understood that in some applications we may wish to increase the energy of the ions. If we examine FIG. 3, in this part of the description, it will become more meaningful. In FIG. 3 there are shown two voltage curves, one being the voltage on the anode and the other being the voltage on the cathode. If we recognize that the horizontal line 58 is at ground potential and that the abscissa is time, then we find that as we vary the anode voltage and the cathode voltage (but keep their difference constant) the current in the plasma will remain constant. The energy with which the ions strike the substrate is directly related to the difference between the anode voltage and ground potential. By keeping the difference between the cathode voltage and the anode voltage constant, we maintain a dense plasma in area 25. By arranging the voltages to be at position 59 in the graph we have reduced the energy with which the ions strike the substrate 49 (FIG. 1). Correspondingly by arranging the voltages to be at position 60, we have increased the energy of the ions. This ability of the present device, i.e., to accelerate and decelerate the ion energy, is useful for instance in a case where ion bombardment from the gun is employed during thin film deposition to supply energy to the film as it deposits, thereby improving film structure.

In addition, in other modes of operation we have found that the external plasma produces a beam predominantly of ions and this ion beam can be of extremely uniform density. Empirically we have determined that said ion beam measured in a horizontal substrate plane, 55 cm above the source aperture maintains a uniformity of beam density on a substrate diameter of 100 cm to within 2.5% of the mean density. It has also been observed that uniformity of density is readily accomplished by holding the difference of potential between the cathode and anode constant and holding the cathode potential approximately at ground.

FIG. 2 depicts a pictorial view of one embodiment of the plasma gun. Even though the right hand end is rectangularly shaped, the elements shown in FIG. 1 are housed in the left hand end and are as described above. The rectangularly shaped section accommodates wiring, water cooling pipes and pipes from the ionizable gas source. It should be understood that the exit aperture plate 43 is easily removable by removing the three screws shown. A variety of plates can be used with different sized apertures to accommodate different applications. It should be further understood that a plurality of magnetic devices along with their associated anodes can be stacked one upon another and fitted within a single housing to provide a plasma chamber of greater depth than the plasma chamber shown in FIG. 1.

We claim:

1. An external plasma gun comprising in combination: magnetic flux generating means generating magnetic flux, said magnetic flux generating means formed: (1) into an endless configuration; (2) to have an inside surface and an outside surface; and (3) to have an aperture therethrough with said magnetic flux oriented substantially parallel to the axis of said aperture; said aperture formed to have first and second ends and formed to be defined by said inside surface; said inside surface formed to have a concave configuration and having first and second ends of said concave configuration whereby said magnetic flux passes from said first end of said concave configuration to said second end of said concave configuration thereby creating an enclosure between said magnetic flux and said inside surface; anode means disposed within said enclosure and adapted to be connected to a first electrical voltage; cathode means formed to fit over said first end of said aperture and adapted to be connected to a second voltage; plate means, having at least one substantially large aperture therein, formed to fit over said second end of said aperture in said magnetic flux generating means; and means to enable ionizable gas to be fed into a plasma chamber formed by said plate means, said cathode means and said magnetic flux passing from said first end of said concave configuration to said second end of said concave configuration whereby when said first and second electrical voltages are respectively connected to said anode means and to said cathode means, in the presence of an ionizable gas, a dense plasma is generated which causes plasma to exist external to said plate means as well as in said plasma chamber.

2. An external plasma gun according to claim 1 wherein said means to enable ionizable gas to be fed into said plasma chamber includes a channel means passing from outside said gun to said plasma chamber and wherein said means to enable ionizable gas to be fed into said plasma chamber includes a baffle formed to substantially cover said first end of said aperture of said magnetic flux generating means and disposed so that between said baffle and said cathode there is formed a gas conduit which directs gas to be fed into said plasma chamber uniformly from around the periphery of said plasma chamber.

3. An external gun according to claim 1 wherein said means to enable ionizable gas to be fed into said plasma chamber is structured so that said ionizable gas is uniformly passed through said magnetic shield into said plasma chamber.

4. An external gun according to to claim 1 wherein said plate means is structured to be secured by bolt like means whereby said plate means is easily removable and therefore easily interchangeable with other plate means having different sized apertures from one another.

5. An external plasma gun according to claim 1 wherein said first and second electrical voltage means are each variable voltage sources and wherein said first and second voltage means can be independently varied to maintain a dense plasma in said plasma chamber while at the same changing the energy of ions included in said external plasma.

6. An external plasma gun according to claim 5 wherein a difference between said first and second voltage is held substantially constant and wherein said second voltage is held at approximately ground whereby there results an ion having extremely uniform density.

7. An external plasma gun according to claim 1 wherein said magnetic flux generating means includes at least one permanent magnet.

8. An external plasma gun according to claim 1 wherein there is further included a housing means and wherein said cathode means is part of said housing means.

9. An external plasma gun according to claim 1 wherein there are at least ions and electrons emanating from said plasma which is external to said plate and wherein there is included a substrate disposed in the path of said ions and electrons and whereby a charge is developed on said substrate in response to said ions striking said substrate and ultimately, at least some of said charge is neutralized by said electrons coming in contact with said substrate.

10. A plasma generating device comprising in combination: an endless configured magnetic flux generating means which generates magnetic flux and which is formed: (1) to have an inside surface and an outside surface; and (2) to have an aperture therethrough having a length dimension and with said magnetic flux oriented substantially parallel to said length dimension of said aperture; said aperture formed to have first and second ends and formed to be defined by said inside surface; said inside surface formed to have a concave configuration and having first and second ends of said concave configuration whereby said magnetic flux passes from said first end of said concave configuration to said second end of said concave configuration thereby creating an enclosure between said magnetic flux and said inside surface; anode means disposed within said enclosure and adapted to be connected to a first electrical voltage; cathode means formed to at least fit over said first end of said aperture and adapted to be connected to a second voltage; exit plate means formed to fit over said second end of said aperture in said magnetic flux generating means; and baffle means formed to fit within said aperture and to substantially cover said first end of said aperture and disposed so that between said baffle and said cathode there is formed a gas conduit which directs gas to be fed into a plasma chamber, defined by said exit plate means, said magnetic flux and said cathode, uniformly around the periphery of said plasma chamber.

11. A plasma generating device comprising in combination: an endless configured magnetic flux generating means which generates magnetic flux and which is formed: (1) to have an inside surface and an outside surface; and, (2) to have an aperture therethrough having a length dimension and with said magnetic flux oriented substantially parallel to said length dimension of said aperture; said aperture formed to have first and second ends and formed to be defined by said inside surface; said inside surface formed to have a concave configuration and having first and second ends of said concave configuration whereby said magnetic flux passes from said first end of said concave configuration to said second end of said concave configuration thereby creating an enclosure between said magnetic flux and said inside surface; anode means disposed within said enclosure and adapted to be connected to a first electrical voltage source; cathode means formed to at least fit over said first end of said aperture and adapted to be connected to a second voltage source; exit plate means formed to fit over said second end of said aperture in said magnetic flux generating means; means to pass ionizable gas into a plasma chamber, defined by said plate means, said magnetic flux and said cathode; first and second independently variable d.c. voltage means respectively connected to said anode means and said cathode means whereby said first and second voltage source can be varied to cause ions leaving a plasma generated in said plasma chamber to be either accelerated and alternatively decelerated.

* * * * *